United States Patent [19]
Kato et al.

[11] Patent Number: 4,847,619
[45] Date of Patent: Jul. 11, 1989

[54] PERFORMANCE-BASED RESET OF DATA COMPRESSION DICTIONARY

[75] Inventors: Jeff J. Kato; David W. Ruska, both of Greeley; David J. Van Maren, Fort Collins, all of Colo.

[73] Assignee: Hewlett-Packard Company, Palo Alto, Calif.

[21] Appl. No.: 109,970

[22] Filed: Oct. 19, 1987

[51] Int. Cl.⁴ ............................................. H03M 7/46
[52] U.S. Cl. .................................... 341/106; 341/51; 341/59; 358/261
[58] Field of Search ................ 364/900, 200; 358/261; 360/39, 40, 48; 340/347 DD; 341/106, 90, 87, 89, 50, 59, 67

[56] References Cited

U.S. PATENT DOCUMENTS

| | | | |
|---|---|---|---|
| 3,906,485 | 9/1975 | Hong et al. | 341/59 |
| 4,387,364 | 6/1983 | Shirota | 341/59 |
| 4,464,650 | 8/1984 | Eastman et al. | 340/347 DD |
| 4,558,302 | 12/1985 | Welch | 340/347 DD |
| 4,586,027 | 4/1986 | Tsukiyama et al. | 340/347 DD |
| 4,609,907 | 9/1986 | Adler et al. | 341/106 |

Primary Examiner—William M. Shoop, Jr.
Assistant Examiner—Brian Young
Attorney, Agent, or Firm—William W. Cochran, II

[57] ABSTRACT

An adaptive data compression system is reset when performance drops below a predetermined threshold to permit greater compression of long files with evolving distributions of symbol combinations. The compression system uses a resettable dictionary in which initially unassigned codes are strategically assigned to symbol combinations as they are encountered in the data stream.

The difference between the bit-lengths of corresponding lengths of the compressor input and output is compared with a value representing a predetermined performance threshold. The dictionary can be reset if the actual performance falls below the performance threshold. The reset can be inhibited while the dictionary is less than half-full to ensure that performance measures are statistically significant. However, if the performance is such that data expansion is occurring, reset is not so delayed.

12 Claims, 1 Drawing Sheet

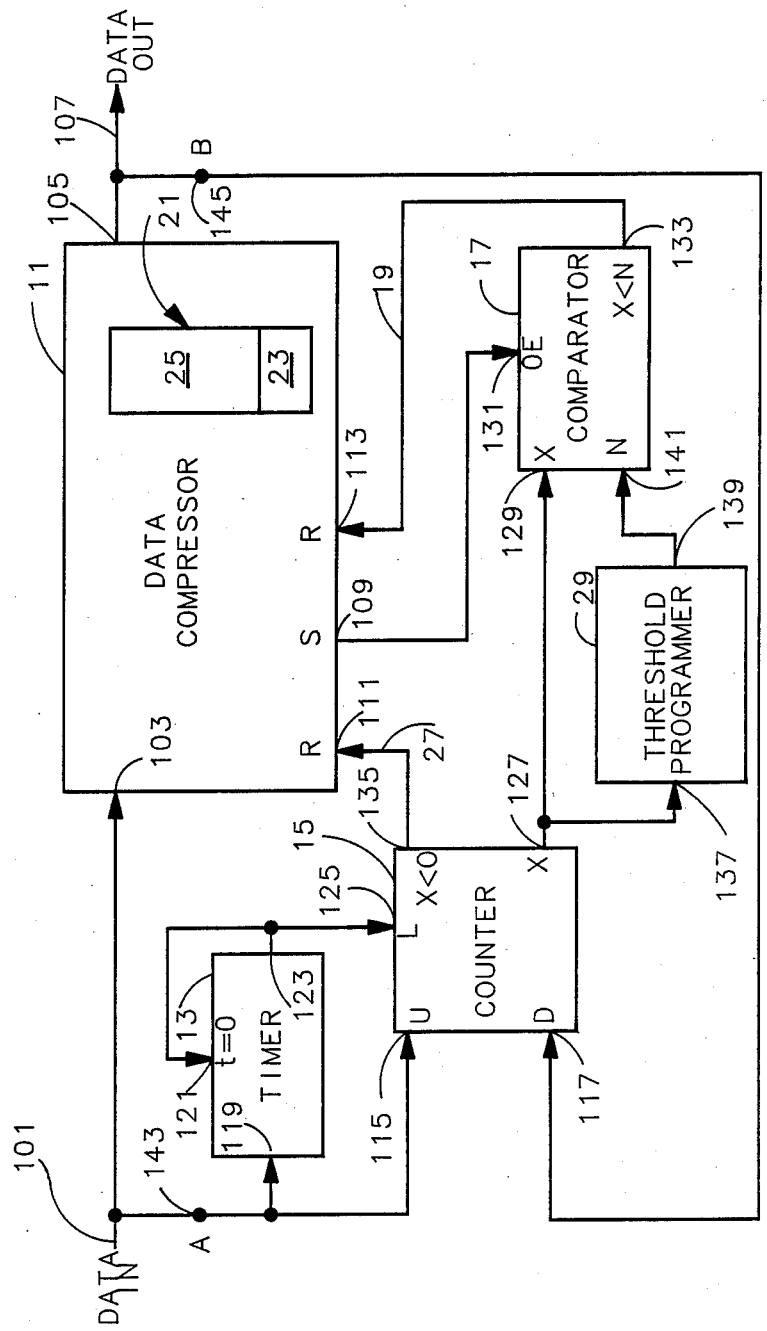

4,847,619

PERFORMANCE-BASED RESET OF DATA COMPRESSION DICTIONARY

BACKGROUND OF THE INVENTION

The present invention relates to data storage and communications and, more particularly, to data compression. A major objective of the present invention is to provide improved performance in adaptive data compression systems.

Data compression is the reversible re-encoding of information into a more compact expression. This more compact expression permits information to be stored and/or communicated more efficiently, generally saving both time and expense. A typical encoding scheme, e.g., those based on ASCII, encode alphanumeric characters and other symbols into binary sequences. A major class of compression schemes encode symbol combinations using binary sequences not otherwise used to encode individual symbols. Compression is effected to the degree that the symbol combinations represented in the encoding scheme are encountered in a given text or other file. By analogy with bilingual dictionaries used to translate between human languages, the device that embodies the mapping of uncompressed code into compressed code is commonly referred to as a "dictionary".

The present invention is primarily applicable to dictionary-based compression schemes, which are part of a larger class of sequential compression schemes. These are contrasted with non-sequential schemes which examine an entire file before determining the encoding to be used. Other sequential compression schemes, such as run-length limited (RLL) compression, can be used in conjunction with the present invention.

Generally, the usefulness of a dictionary-based compression scheme is dependent on the frequency with which the symbol combination entries in the dictionary are matched as a given file is being compressed. A dictionary optimized for one file type is unlikely to be optimized for another. For example, a dictionary which includes a large number of symbol combinations likely to be found in newspaper text files is unlikely to compress effectively data base files, spreadsheet files, bit-mapped graphics files, computer-aided design files, Musical Instrument Data Interface (MIDI) files, etc.

Thus, a strategy using a single fixed dictionary might be best tied to a single application program. A more sophisticated strategy can incorporate means for identifying file types and select among a predetermined set of dictionaries accordingly. Even the more sophisticated fixed dictionary schemes are limited by the requirement that a file to be compressed must be matched to one of a limited number of dictionaries. Furthermore, there is no widely accepted standard for identifying file types, essentially limiting multiple dictionary schemes to specific applications or manufacturers.

Adaptive compression schemes are known in which the dictionary used to compress a given file is developed as that file is being compressed. Entries are made into a dictionary as symbol combinations are encountered in the file. The entries are used on subsequent occurrences of an encoded combination. Compression is effected to the extent that the symbol combinations occurring most frequently in the file are encountered as the dictionary is developing. Systems incorporating adaptive compression schemes can include means for cleaning the dictionary between files so that the dictionary can be adapted on a file-by-file basis.

Adaptive compression systems and methods are disclosed in U.S. Pat. No. 4,464,650 to Eastman et al. and U.S. Pat. No. 4,558,302 to Welch. These references explain further the use of dictionaries in both adaptive and non-adaptive compression strategies. Further pertinent references to compression strategies include: G. Herd, "Data Compression: Techniques and Applications - Hardware and Software Considerations, Wiley, 1983; R. G. Gallager, "Variations on a Theme of Huffman", IEEE Transactions on Information Theory, Vol. IT-24, No. 6, pp. 668–674, November 1978; J. Ziv and A. Lempel, "A Universal Algorithm for Sequential Data Compression", IEEE Transactions on Information Theory, Vol. IT-23, No. 3, pp. 337–343, May 1977; J. Ziv and A. Lempel, "Compression of Individual Sequences via Variable Rate Coding", IEEE Transactions of Information Theory, Vol. IT-24, No. 5, pp. pp. 530–536, September 1978; and T.A. Welch, "A Technique for High Performance Data Compression", IEEE Computer, June 1984.

In an adaptive compression scheme, the degree of compression depends on the extent to which the portion of the file used to develop the dictionary resembles the remainder of the file. "Resembles" is used here to refer to a similarity in symbol-combination frequency distributions. However, especially with certain long files, the frequency distribution of symbol combinations can shift dramatically over the length of a file. For example, a financial report beginning with a verbal description of a company and its performance and concluding with primarily tabular numeric data would not be compressed optimally when the dictionary was completed before the numeric tables were encountered.

Accordingly, a compression scheme is desired which provides the advantages of adaptive compression schemes but yields improved performance for long files with changing frequency distributions of symbol combinations. Such a scheme should be adapted to communications and storage systems without requiring special file type codes so that the scheme can be applied effectively to a great variety of file types.

SUMMARY OF THE INVENTION

The present invention provides for a compression scheme in which a dictionary can be reset during file compression in response to feedback from a performance monitoring function. More specifically, the dictionary can be reset when performance falls below a selected threshold.

In a preferred embodiment, the reset function is inhibited until the dictionary is sufficiently developed for a meaningful performance evaluation. For example, the reset function can be inhibited until an appropriate percentage of the assignable codes have been assigned to symbol combinations. However, if during this part of the dictionary's development, the performance falls below a second threshold, the dictionary is reset anyway. More specifically, if the compressor is expanding rather than compressing, the dictionary can be reset even if only a minority of its assignable codes have been assigned.

The performance monitoring function can involve an up/down counter which determines the difference between the numbers of input bits and output bits for a given data block. This difference can be made to correspond to a compression ratio by fixing the length of the data block over which the difference is determined. A timer in the form of a simple counter can be used to trigger a read of the up/down counter after a fixed number of input bits.

The threshold below which a reset is triggered, for example, by a comparator, can be fixed. Alternatively, a threshold programmer can be used to adjust the threshold.

In the case of files which maintain a relatively constant combination frequency distribution, resets are not made and the present invention emulates the schemes of the prior art. In the case of long files over which combination distributions change, improved performance is achieved by allowing the dictionary to be re-developed for different distinct portions of a long file. Other features and advantages of the present invention are apparent from the description below with reference to the following drawing.

BRIEF DESCRIPTION OF THE DRAWING

The FIGURE is a schematic view of a data compression system in accordance with the present invention.

DESCRIPTION OF THE PREFERRED EMBODIMENTS

The present invention provides for a data compression system including a data compressor 11, a timer 13, an up/down counter 15 and a comparator 17, as shown in the FIGURE. Timer 13 and up/down counter 15 constitute a performance monitor, the output of which can be compared to a threshold by comparator 17. A reset loop is closed by a line 19 connecting the comparator output to one of two reset inputs of data compressor 11.

Data compressor 11 includes a dictionary 21 with a fixed section 23 and a programmable section 25. Fixed section 23 includes codes which are preassigned to certain inputs, such as individual symbols. Programmable section 25 includes codes which are assignable, for example, to symbol combinations. According to a predetermined adaptive compression strategy, certain of the symbol combinations encountered in an input file are assigned available dictionary codes.

The illustrated dictionary 21 has about four thousand codes, of which about 95% are in the programmable section 25. Thus, once dictionary 21 is filled, i.e., all of its assignable codes assigned, each of a great majority of dictionary codes can be used to represent multiple input codes, thus promoting data compression.

The reset strategy employed in the data compression system of the FIGURE is twofold. Basically, dictionary 21 is cleared, i.e., reset, when compression performance falls below a predetermined threshold, provided dictionary 21 has developed far enough for the performance determination output by up/down counter 15 to be meaningful. In addition, a reset occurs via line 27 without regard to dictionary development when it is determined that the data stream is expanding rather than contracting.

Data compressor 11 receives data from a "data in" line 101 at an input 103 and directs, from an output 105, re-encoded, and preferably compressed, data to a "data out" line 107. In addition, data compressor 11 includes a status output 109 indicating when dictionary 21 is one-half full and two functionally equivalent reset inputs 111 and 113 which can be used to reset dictionary 21 in accordance with feedback from counter 15 or comparator 17. When data compressor 11 is reset, dictionary 21 is cleared for "re-development" as the nature of the file being compressed changes.

Up/down counter 15, otherwise characterizable as a bi-directional counter, counts up each bit it receives at an input 115 representing data input and counts down for each bit it receives at an input 117 representing data output and thus reflects the difference between the input and output code lengths for a given data block. Block length can be measured in bits or multiples thereof. The magnitude and sign of a difference in length reflect the performance of data compressor 11.

Since compressor ratios rather than differences are of interest, it is necessary to relate this difference to the absolute number of input data bits received at an input 115. This function is provided by timer 13. Timer 13 fixes the data block length over which performance is assessed so that the differences read out from up/down counter 15 can be converted to compression ratios. Timer 13 can be a simple unidirectional counter which receives data at an input 119 and which resets itself using an input 121 and provides an output signal from an output 123 when a predetermined count is reached. The illustrated timer 13 is a 1K counter. As an alternative, a programmable counter can be used to provide for variable sample sizes.

When an output signal from timer 13 activates a latch input L 125 of up/down counter 15, its current value X is latched and up/down counter 15 itself is cleared. The latched value X, representing the difference between the bits received at input 115 less the bits received at input 117, is directed from an output 127 an input 129 of comparator 17 for comparison with a preset threshold N. If the latched value X exceeds the threshold, dictionary 21, with its current mapping to symbol combinations, is providing satisfactory compression; therefore, no reset signal is issued. However, if the difference falls below the predetermined threshold, i.e., $X<N$, a reset signal can be issued along line 19 to clear dictionary 21.

Compression performance is inherently limited at the beginning of dictionary development. Thus the illustrated system directs the status output 109 of compressor 11 to an output enable input 131 of comparator 17 to prevent reset for less than optimal performance before dictionary 21 is half-full. Once dictionary 21 is at least half-full, comparator output 133 is activated to direct a signal to reset input 113 so that if the programmed threshold is not met, dictionary 21 is reset.

However, if latched counter value X is negative, the compression ratio is less than one and the data is being expanded rather than compressed. Accordingly, a negative value indicated by an active signal from an output 135 to reset data compressor 11 via input 111 whether or not dictionary 21 is half-full. The illustrated dictionary 21 has a capacity of 4K and so will be about ¼ full after 1K bytes of input with little or no matching of symbol combinations.

The threshold input to the comparator can be a predetermined constant. However, the illustrated system includes a threshold programmer 29 for varying the threshold based on the compression performance history of the file as indicated by a series of outputs from up/down counter 15 received at an input 137. Threshold programmer 29 directs a threshold signal from its output 139 to an input 141 of comparator 17. This arrangement permits a higher threshold can be set for a file where high compression ratios have been achieved, and lower thresholds can be set for files with low maximum compression ratios.

In this regard, it is noted that files differ greatly in the extent to which they can be compressed by any strategy. Accordingly, a higher threshold can be used to detect performance degradation in the latter portions of a file in which a relatively great compression ratio has been achieved in the earlier portions. On the other hand, a lower threshold can be applied when it appears that the compression ratio achieved, although relatively low, has remained near a file maximum and thus is optimal for the current file.

In the illustrated embodiment a compression ratio below unity, indicated by a negative output from up/-down counter 15, serves as a lower threshold which is operative even while dictionary 21 is less than half full. In alternative embodiments, the lower threshold can be set elsewhere. Other embodiments incorporate more complex relationships between dictionary status and thresholds.

In a variation of the illustrated system, two series combinations of a counter and pre-scaler (programmable divider) are inserted at node A 143 and at node B 145 so that counting ranges for the timer and the up/-down counter need not be very wide. Provisions can be made for making the timer programmable to allow longer and shorter sample periods.

The level of dictionary development can be made adjustable so that levels other than ½ can be used to control whether or not the comparator can reset the dictionary. Of course, a wide range of adaptive compression strategies can be employed by the compressor. In addition, the adaptive strategy can be used in combination with various strategies, such as run length compression. These and other variations and modifications on the described embodiments can be made on the present invention, the scope of which is limited only by the following claims.

What is claimed is:

1. A system comprising:
   compressor means for processing a digital data stream according to a predetermined adaptive compression strategy, said compressor means including:
      compressor input means for receiving an input stream to be compressed, said input stream including strings of input codes, each string including at least one input code, each input code having a respective bit-length,
      compressor output means for outputting an output stream yielded by said compression strategy, said output stream including output codes, each output code having a respective bit-length,
      dictionary means for translating said strings into said output codes, said dictionary means having a predetermined code set of entries, each of said entries corresponding to a respective one of said output codes, said code set including an assignable set of assignable entries, said assignable set including an assigned subset of assigned entries and an unassigned subset of unassigned entries, at any given time said assigned subset having a non-negative number of elements, at any given time said unassigned subset having a non-negative number of elements, each of said assigned entries having its respective output code assigned to a respective one of said strings, each of said unassigned entries having no string assigned to its respective output code; and
      assignment means for, in accordance with said compression strategy, assigning unassigned ones of said assignable entries to strings received by said compressor input means;
   monitor means for providing a bit-length comparison value as a function of the bit-lengths of a string series of said strings and a translation of said string series into said output codes, said monitor means being coupled to said compressor input means and said compressor output means; and
   clearing means for converting at least some of said assigned entries to unassigned entries when said bit-length comparison value meets a predetermined comparison criterion, said clearing means being coupled to said monitor means and said compressor means.

2. The system of claim 1 wherein said dictionary means has an initial state in which all assignable entries are unassigned entries, said clearing means converting all of said assigned entries to unassigned entries when said bit-length comparison value meets said predetermined comparison criterion, said clearing means being coupled to said monitor means and said compressor means.

3. The system of claim 2 further comprising dictionary level means for providing dictionary status information regarding the extent to which said assignable entries are assigned entries at any given time, said dictionary level means being coupled to said clearing means so that said clearing means can reset said dictionary as a function of said bit-length comparison value and said dictionary status information.

4. The system of claim 2 wherein said dictionary level means provides a dictionary status signal to said clearing means indicating whether a predetermined percentage of said assignable entries has been assigned.

5. The system of claim 4 wherein said clearing means resets said dictionary means to its initial state when said comparison value indicates that the bit-length of said translation exceeds the bit length of said series of strings, said clearing means also resetting said dictionary means when said comparison value meets said predetermined comparison criterion provided said predetermined percentage of assignable entries has been achieved as indicated by said dictionary level means.

6. The system of claim 2 wherein:
   said monitor means includes
   bi-directional counter means for providing said comparison value in the form of a bi-directional count by counting in one direction in proportion to a number of bits in said string series and by counting in the opposite direction in proportion to the number of bits in said translation of said string series, and
   unidirectional counter means coupled to said compressor input means for detecting when a predetermined number of input bits have been received, said uni-directional counter means being coupled to said bi-directional counter so as to enable it to provide a bi-directional count to said clearing means when the predetermined number of input bits has been received; and
   a comparator for comparing said bi-directional count output from the bi-directional counter with said comparison criterion.

7. The system of claim 1 further comprising:
   programming means for programming said clearing means with comparison criteria as a function of comparison values previously indicated by said monitor means, said programming means being coupled to said monitoring means.

8. A method for compressing data using a data compressor for processing a digital data stream according to a predetermined adaptive compression strategy, said compressor including:

compressor input means for receiving an input stream to be compressed, said input stream including strings of input codes, each string including at least one input code, each input code having a respective bit-length, compressor output means for outputting an output stream yielded by said compression strategy, said output stream including output codes, each output code having a respective bit-length, and dictionary means for translating said strings into said output codes, said dictionary means having a predetermined code set of entries, each of said entries corresponding to a respective one of said output codes, said code set including an assignable set of assignable entries, said assignable set including an assigned subset of assigned entires and an unassigned subset of unassigned entries, at any given time said assigned subset having a non-negative number of elements, at any given time said unassigned subset having a non-negative number of elements, each of said assigned entries having its respective output code assigned to a respective one of said strings, each of said unassigned entries having no string assigned to its respective output code, said dictionary means having an initial state in which said assignable entries are unassigned entries, said method comprising:

inputting said input stream into said compressor, said input stream including input blocks, each input block including code strings, each code string including at least one input code, said compressor translating each input block into a respective output block, each output block including output codes each of which corresponds to a respective one of said strings, each input block being characterizable by an input bit-length and each output block being characterizable by an output bit-length;

assigning, in accordance with said compression strategy, unassigned ones of said assignable entries to strings received by said compressor input means;

comparing the input bit-length of each input block with the output bit-length of the corresponding output block so as to provide a bit-length comparison value for each input block, the comparison value for a given block being determined after said given block is translated by said dictionary means; and clearing at least some of said assigned entries to unassigned entries when an input block received by said compressor results in a comparison value meeting a predetermined comparison criterion.

9. The method of claim 8 wherein said clearing step involves converting all of said assigned entries to unassigned entries so that said dictionary is reset to said initial state.

10. The method of claim 9 further comprising:

setting said comparison criterion as a function of comparison values associated with input blocks received since the most recent reset of said dictionary to said initial state.

11. The method of claim 9 further comprising:

prior to said clearing step, waiting until said assignment means has assigned strings to a predetermined percentage of assignable entries in said dictionary.

12. The method of claim 11 wherein:

if during said waiting step, said comparison value meets a predetermined second comparison criterion, resetting said dictionary to its initial state irrespective of the precentage of assignable entries which have been assigned.

* * * * *